United States Patent [19]

Sutherland, II

[11] Patent Number: 4,700,114
[45] Date of Patent: Oct. 13, 1987

[54] VERTICAL DEFLECTION CIRCUIT

[75] Inventor: Hugh F. Sutherland, II, Indianapolis, Ind.

[73] Assignee: RCA Corporation, Princeton, N.J.

[21] Appl. No.: 852,358

[22] Filed: Apr. 15, 1986

[51] Int. Cl.⁴ .................. H01J 29/70; H01J 29/72
[52] U.S. Cl. ................................... 315/389; 315/8; 315/397
[58] Field of Search ................... 315/396, 397, 389, 8

[56] References Cited

U.S. PATENT DOCUMENTS

| | | |
|---|---|---|
| 3,727,096 | 4/1973 | Wilcox . |
| 3,735,192 | 5/1973 | Avery . |
| 4,052,645 | 10/1977 | Fujita . |
| 4,096,416 | 6/1978 | Henley ............................... 315/397 |
| 4,147,963 | 4/1979 | Shiotani . |
| 4,289,994 | 9/1981 | Beaumont et al. ................. 315/397 |
| 4,535,270 | 8/1985 | Frantz et al. .......................... 315/8 |

OTHER PUBLICATIONS

Report MRZ-305, "Resonant Degaussing Circuit", by P. Haferl, Laboratories RCA Ltd., Zurich, Switzerland, dated Mar. 1986.
U.S. patent application, Ser. No. 853,421, P. E. Haferl, entitled "Resonant Degaussing Apparatus", filed Apr. 18, 1986.
Training Manual WC 21, CTC 108 Television Workshop, Servicing the CTC 108 XL-100 Color Chassis, published by RCA Corporation Consumer Electronics, dated 1980, pp. 42-47 inclusive.
RCA Television Service Data, Chassis CTC 108 Series, published by RCA Corporation Consumer Electronics, dated 1981, pp. 11 and 24-28 inclusive.

*Primary Examiner*—Theodore M. Blum
*Attorney, Agent, or Firm*—Eugene M. Whitacre; Paul J. Rasmussen; Joseph J. Laks

[57] ABSTRACT

A vertical deflection amplifier of a video display apparatus includes first and second transistor amplifier output stages arranged in a totem-pole, push-pull configuration. A vertical deflection winding is coupled to the output stages at a deflection amplifier output terminal. An S-capacitor is coupled to the deflection winding at a second terminal remote from the output terminal. A source of deflection rate signals is coupled to the deflection amplifier for generating a deflection current in the deflection winding. A base current generating circuit is coupled to one of the transistor amplifier output stages for providing base current thereto. The S-capacitor voltage is applied to the base current generating circuit for enabling conduction of base current in the one amplifier output stage. When the video display apparatus is first turned on, the initially discharged S-capacitor is slowly charged from a DC voltage supply to delay generation of vertical deflection past completion of picture tube degaussing.

19 Claims, 3 Drawing Figures

VERTICAL DEFLECTION CIRCUIT

This invention relates to deflection amplifier circuitry.

In a typical linearly operated vertical deflection circuit, first and second output transistors are coupled together in a push-pull configuration at a deflection amplifier output terminal. A vertical deflection winding, in series with an S-shaping capacitor, is coupled to the output terminal. A vertical rate, sawtooth input signal is coupled to the deflection amplifier to generate a sawtooth vertical deflection current in the deflection winding.

During the first half of vertical trace, the top output transistor is conducting to generate the first half of the vertical deflection current and to charge the S-shaping capacitor from a DC voltage source. During the second half of vertical trace, the bottom output transistor is conducting to apply the S-capacitor voltage to the deflection winding for generating the second half of the vertical deflection current. The S-shaping capacitor is discharged by the vertical deflection current through the bottom transistor. Except for a small overlap interval at the center of trace, the top output transistor is nonconductive when the bottom transistor is conductive.

DC negative feedback of the amplifier output voltage or of the S-capacitor voltage establishes correct DC biasing of the deflection amplifier. Thus, for example, should the S-capacitor voltage tend to decrease, the DC feedback increases conduction of the top output transistor to increase the charging current to the S-capacitor from the DC voltage source, thereby maintaining the proper DC operating point.

A fault operating condition may arise where the S-capacitor becomes short-circuited, decreasing the DC voltage at the amplifier output terminal to very low values. The DC negative feedback loop tries to restore the DC output voltage by turning on the top output transistor to full or near full conduction in an attempt to recharge the S-capacitor from the DC voltage source via the vertical deflection winding.

Such fault mode operation may be undesirable in that excessive power dissipation may result in the top output device and in any current limiting resistor in series with the DC voltage source. Furthermore, the large unidirectional current flowing in the deflection winding during fault mode operation, may deflect the electron beams to such an extreme angle that they strike the picture tube neck, causing neck heating and possible tube breakage.

A feature of the invention is a vertical deflection circuit with amplifier drive circuitry that avoids such undesirable operation in a fault operating mode. A deflection amplifier includes first and second transistor amplifier output stages. A deflection winding is coupled to the first and second transistor amplifier output stages at a deflection amplifier output terminal. An S-shaping capacitance is coupled to the deflection winding. A source of deflection rate signals is coupled to the deflection amplifier for generating a deflection current in the deflection winding. A base current generating circuit is coupled to one of the transistor amplifier output stages for providing base current thereto. The base current generating circuit is coupled to the second terminal and has an S-capacitance voltage applied thereto for enabling the conduction of the base current.

In carrying out an aspect of the invention, a main charging path of the S-capacitance is provided via the top output stage of a deflection amplifier arranged in a push-pull configuration. A second, slower charging path for the S-capacitance is also provided which bypasses the top output stage. Conduction of base current to the top output stage is enabled only when the S-capacitance voltage is greater than a predetermined magnitude.

During start-up, when the S-capacitance is initially discharged, the main charging path is disabled. The second charging path charges the S-capacitor to the voltage level needed to enable operation of the top output device. By proper selection of the charging rate in the second charging path, a start-up delay is provided to operation of the vertical deflection circuit. The start-up delay enables picture tube degaussing to be completed before vertical deflection current is generated. This prevents the vertical deflection magnet field from undesirably affecting the degaussing process.

In accordance with another inventive feature, a degaussing circuit is responsive to an on-off switch for providing degaussing action during a degaussing interval initiated when the on-off switch is switched to an on position. A vertical deflection circuit includes a vertical deflection winding and a capacitor in which capacitor there is developed a vertical rate voltage during steady-state operation that controls the generation of vertical deflection current in the vertical deflection winding. A DC power supply generates a DC supply voltage that energizes the deflection circuit. The DC power supply is responsive to the on-off switch to generate the DC supply voltage after the on-off switch is switched to the on position. The DC supply voltage attains a level adequate to energize the vertical deflection circuit prior to the conclusion of the degaussing interval. A means for charging the capacitor from the DC power supply is provided that charges the capacitor after the on-off switch is switched to the on position at a sufficiently slow rate to delay the generation of vertical deflection current pass the conclusion of the degaussing interval.

Figure 1:
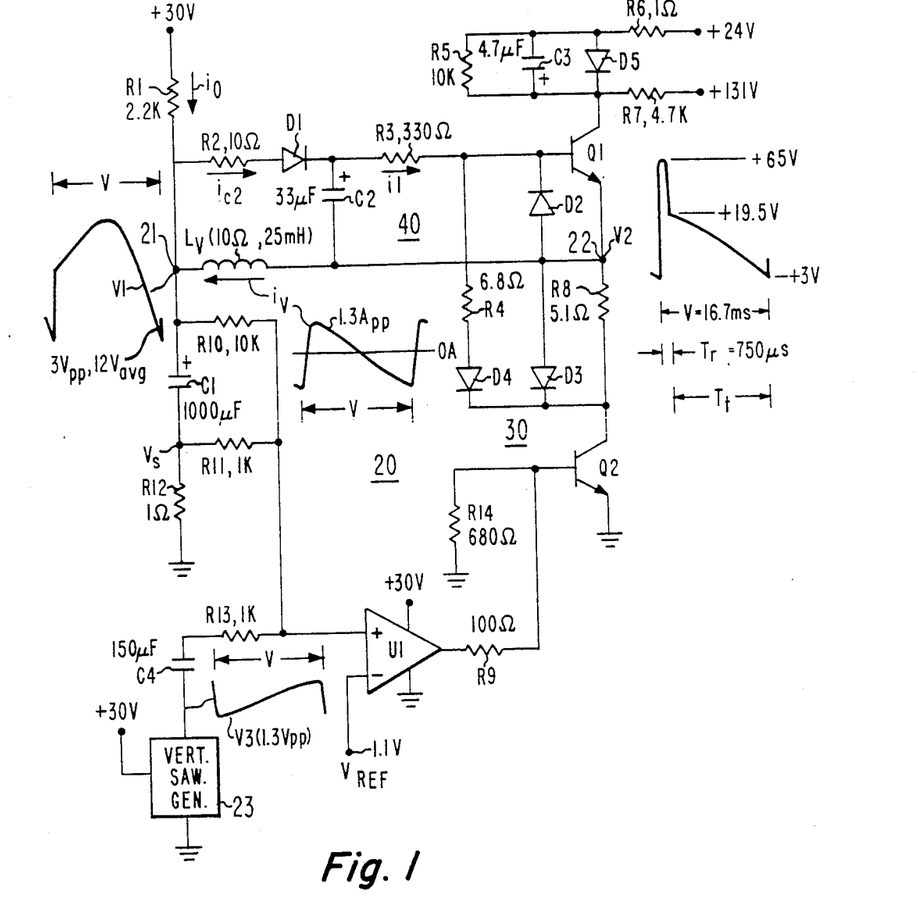
FIGS. 1 and 2 illustrate two different inventive embodiments of a vertical deflection circuit.

In vertical deflection circuit 20 of FIG. 1, a vertical deflection amplifier 30 comprises output transistor stages Q1 and Q2 coupled together in a push-pull configuration at an amplifier output terminal 22. A vertical deflection winding $L_V$ is coupled to terminal 22. An S-capacitor C1 is coupled to deflection winding $L_V$ at a second terminal 21 remote from output terminal 22. A current sampling resistor R12 is coupled between the lower terminal of capacitor C1 and ground.

The collector of bottom output transistor Q2 is coupled to the base of top output transistor Q1 via a resistor R4 and a diode D4 to form a totem-pole configuration, wherein base drive for top transistor Q1 is shunted through bottom transistor Q2. A resistor R8 is coupled between output terminal 22 and the collector of transistor Q2 to reduce crossover distortion. A diode D3 parallels resistor R8 and becomes conductive during the second half of vertical trace to shunt current away from resistor R8 at large deflection current amplitudes during the second half of trace. This reduces overall power dissipation during the second half of vertical trace and enables a lower DC operating point to be selected for output terminal 22. A +24 V supply source is coupled to the collector of transistor Q1 via a small current limiting resistor R6 and a diode D5.

The control circuitry for deflection amplifier 30 includes a vertical sawtooth generator 23 that develops a vertical rate sawtooth voltage V3 that is AC coupled to the noninverting input terminal of a driver amplifier U1 via a capacitor C4 and a resistor R13. A reference voltage $V_{REF}$ is coupled to the inverting input terminal. The output of driver U1 is coupled to the base of bottom transistor Q2 via resistor R9 of biasing resistors R9 and R14.

A base current generating circuit 40, embodying an aspect of the invention, generates a base current i1 for top output transistor Q1. Base current generating circuit 40 includes a bootstrap capacitor C2 having a lower terminal coupled to amplifier output terminal 22 at the emitter of transistor Q1 and an upper terminal coupled to the junction of a diode D1 and a resistor R3. Resistor R3 is coupled to the base of transistor Q1. Bootstrap capacitor C2 is charged by a current $i_{c2}$ flowing from terminal 21 via a relatively small valued resistor R2 and diode D1. The value of current $i_{c2}$ is established in accordance with the S-capacitor voltage V1 established at terminal 21. During normal steady-state deflection circuit operation, voltage V1 is a vertical rate parabola voltage, skewed downwardly by the superimposed sawtooth voltage $V_s$ developed across sampling resistor R12.

Near the beginning of the vertical trace interval $T_t$, output transistor Q1 is conducting a positive vertical deflection current $i_V$ to charge S-capacitor C1 from the +24 V supply via resistor R6 and diode D5. Bootstrap capacitor C2 provides the forward base current for transistor Q1 during the early portions of vertical trace. Near the beginning of vertical trace, deflection amplifier output voltage V2 developed at terminal 22 is sufficiently greater than S-capacitance voltage V1 to reverse bias diode D1 and prevent the recharging of bootstrap capacitor C2.

The decreasing, positive sawtooth portion of vertical deflection current $i_V$ during the first half of vertical trace is produced as a result of the decreasing conduction of top output transistor Q1. In the totem-pole deflection amplifier arrangement, the upwardly ramping sawtooth input voltage V3 is amplified by driver U1 to increase the conduction of bottom output transistor Q2, thereby increasing the amount of current shunted away from the base of transistor Q1 via resistor R4 and diode D4. At some point near the center of vertical trace, transistor Q2 shunts enough base current i1 to cutoff conduction in output transistor Q1.

During the second half of vertical trace, with transistor Q2 conductive, S-capacitor voltage V1 drives vertical deflection current $i_V$ in the negative direction via transistor Q2. Amplifier U1 increases the conduction of transistor Q2 as the second half of vertical trace progresses to generate the negative portion of the downwardly ramping vertical deflection current.

During the vertical trace interval $T_t$, output voltage V2 is a downwardly ramping voltage. At some instant after the center of trace, S-capacitor voltage V1 has increased and output voltage V2 has decreased to values which enable diode D1 to become forward biased. At this time, bootstrap capacitor C2 is recharged by current $i_{c2}$ to the S-capacitor voltage V1. With diode D1 conducting, S-capacitor terminal 21 sources currents $i_{c2}$ and i1.

When diode D1 first begins conducting after the center of vertical trace, deflection current $i_V$ flows into terminal 21 and is large enough to be the main source for current $i_{c2}$. Near the center of trace and during the second half of trace, S-capacitor C1 becomes the main source for current $i_{c2}$.

To maintain scan linearity, the AC sawtooth sampling voltage $V_s$, developed across current sampling resistor R12, is summed via a resistor R11 with the 180° out-of-phase sawtooth input voltage V3 at the noninverting input terminal of amplifier U1.

To stablize the DC operating point of output terminal 22 at a predetermined average value, S-capacitor voltage V1, developed at terminal 21, is DC coupled to the noninverting input terminal of driver U1 via a resistor R10. A negative feedback loop is formed from output terminal 22 that includes deflection winding $L_V$, terminal 21, driver amplifier U1 and bottom output transistor Q2. Should, for example, S-capacitor voltage V1 tend to decrease, this decrease in voltage is applied to driver U1 to decease conduction of transistor Q2. Conduction in transistor Q1 is increased to recharge capacitor C1 to its stabilized average value.

To initiate the vertical retrace interval $T_r$, sawtooth input voltage V3 abruptly decreases, producing the cutoff of bottom output transistor Q2 at the end of trace. A resonant retrace interval is initiated that charges a transistor Q2 becomes cutoff, output voltage V2 begins to increase due to the inductive kick provided by deflection winding $L_V$. Voltage V2 forward biases a retrace diode D2 coupled between the base and emitter electrodes of transistor Q1, and forward biases the base-collector diode of transistor Q1. Deflection current $i_V$ flows via retrace diode D2 and reverse base-collector conduction into retrace capacitor C3 and the +24 volt supply. Deflection current $i_V$ begins to rapidly ramp up during retrace.

During retrace, when deflection current $i_V$ is negative, bootstrap capacitor C2 is discharged by deflection current $i_V$ via reverse collector conduction of transistor Q1. When deflection current $i_V$ ramps up during retrace through its zero current value, the inductive action of deflection winding $L_V$ decreases output voltage V2 at the emitter of transistor Q1 by an amount that enables diode D2 to become reverse biased. Bootstrap capacitor C2 begins to discharge into the base of top output transistor Q1, maintaining the transistor in saturated conduction throughout the remainder of the retrace interval.

At the end of vertical retrace, the positive retrace deflection current $i_V$ has increased to a value that enables sawtooth sampling voltage $V_s$ to reestablish drive to bottom output transistor Q2, thereby initiating the subsequent vertical trace interval. With bottom device Q2 conducting, a shunt path is established for current i1 that bypasses the base of transistor Q1, bringing the transistor out of saturation into the linear mode of operation.

At the end of vertical retrace, some voltage remains in retrace capacitor C3. Capacitor C3 becomes discharged very early within trace by conduction of transistor Q1, after which time diode D5 becomes forward biased.

One terminal of a resistor R7 is coupled to a +131 V DC voltage supply of value greater than the +24 V supply. The other terminal of resistor R7 is coupled to the junction of the collector of transistor Q1 and retrace capacitor C3. A resistor R5 is coupled across retrace capacitor C3. During the second half of vertical trace, when transistor Q1 is cut off, capacitor C3 is precharged to a voltage level that is established by voltage dividing resistors R7 and R5, coupled between the +131 V voltage source and the +24 V voltage source, in accordance with the RC time constant associated with the resistors and capacitor C3. The precharged voltage on retrace capacitor C3 at the end of trace provides a more rapid retrace of vertical deflection current $i_V$, thereby shortening the duration of retrace interval $T_r$.

In accordance with an aspect of the invention, S-capacitor voltage V1 is applied to base current generating circuit 40 independently of the DC stabilizing negative feedback loop, to enable the generation of current i1 when the S-capacitor voltage V1 exceeds a predetermined magnitude.

Base current generating circuit 40 is dependent on S-capacitance voltage V1 as a DC voltage supply source. Should the magnitude of S-capacitance voltage V1 decrease below the predetermined magnitude, base current generating circuit 40 will be unable to generate adequate current i1 to maintain top output transistor Q1 in conduction. The main charging path for S-capacitor C1 is via top output transistor Q1. When base current generating circuit 40 is unable to supply base current to maintain transistor Q1 conductive, this main charging path will be disabled.

Under certain fault operating situations, it may be desirable for the fault to trigger the disabling of base current generating circuit 40 and of the main charging path to capacitor C1. Such a situation may arise, for example, if S-capacitor C1 becomes short-circuited. When S-capacitor C1 becomes short-circuited, voltage V1 will tend to decrease to zero. The DC negative feedback loop via resistor R10 tries to maintain voltage V1 at its stabilized value by turning bottom output transistor Q2 off, in an attempt to maintain transistor Q1 conducting heavily. If base current generating circuit 40 were not disabled in such a situation, large current would flow in the main charging path to the now short-circuited S-capacitor via deflection winding $L_V$, transistor Q1, diode D5 and resistor R6. Excessive dissipation plus possible component failure could result. Furthermore, the large unidirectional current flowing in deflection winding $L_V$ would deflect the electron beams of the picture tube by a large angle, permitting the electron beams to strike and possibly damage the neck of the picture tube.

In accordance with an aspect of the invention, when the S-capacitor voltage decreases below a predetermined magnitude, such as may occur when the S-capacitor becomes short-circuited, voltage V1 becomes too low to provide forward bias to diode D1. Bootstrap capacitor C2 becomes disconnected from its source of charging current, disabling the generation of current i1 into the base of top output transistor Q1. Without base current, transistor Q1 becomes nonconductive, disabling the main charging path into the short-circuit of capacitor C1, thereby avoiding undesirable short-circuit fault operation of vertical deflection circuit 20.

In accordance with another aspect of the invention, an auxiliary or second charging path for capacitor C1 is provided directly to a DC voltage supply, bypassing the main charging path of top output transistor Q1 and the vertical deflection winding $L_V$. A relatively large valued resistor R1 is coupled from a +30 V supply to S-capacitor terminal 21. An auxiliary charging current $i_0$ flows from the +30 V supply via resistor R1 to S-capacitor terminal 21.

When the television receiver is first turned on, S-capacitor C1 is initially in a discharged state. When the power supply for the television receiver generates the DC supply voltages such as the +24 V, +30 V and +131 V voltages, S-capacitor C1 begins to charge with current $i_0$ from the +30 V supply via resistor R1. Due to the relatively large value of S-capacitor C1, voltage V1 remains below the predetermined magnitude required during start-up for enabling base current generating circuit 40. During this substantial start-up delay interval, transistor Q1 remains essentially cutoff, disabling the main charging path for capacitor C1 via deflection winding $L_V$.

When the television receiver is first turned on, the discharged S-capacitor C1 slowly begins to charge with current $i_0$ from the +30 V supply. Voltage V1 begins to increase as C1 charges. As long as voltage V1 is below its normal steady-state value, the DC negative feedback loop maintains transistor Q2 cutoff. No significant current path to ground exists by which bootstrap capacitor C2 may charge.

When S-capacitor C1 has charged sufficiently to permit voltage V1 to increase to approximately or slightly greater than its normal, steady-state value, the DC negative feedback loop turns on transistor Q2, enabling bootstrap capacitor C2 to charge to a value which is capable of forward biasing transistor Q1. Soon afterwards, normal steady-state deflection circuit operation commences.

During steady-state operation, the value of auxiliary charging current $i_0$ is determined by the difference in voltage between the +30 V supply and the steady-state value of S-capacitor voltage V1. The DC component of current $i_0$ flows into terminal 21 from the +30 V supply. By proper selection of component values, such as the value of resistor R3, the DC component of the current flowing in the current path (R2, D1, R3) equals the DC component of current $i_0$. In this situation, no net DC current flows in deflection winding $L_V$ from resistor R1. If the DC component of current i1 differs from the DC component of current $i_0$, the difference current will flow as a DC component in vertical deflection current $i_V$. This difference current is of relatively small value and may be eliminated, if so desired, by proper adjustment of a DC centering control circuit for deflection winding $L_V$, not illustrated in FIG. 1.

For the values given in the circuit of FIG. 1, the start-up delay time for the generation of vertical deflection current is approximately one to two seconds. The start-up delay advantageously permits completion of picture tube degaussing before the generation of vertical deflection current, thereby avoiding any undesirable interaction between the vertical deflection magnetic field and the degaussing process.

Figure 3:
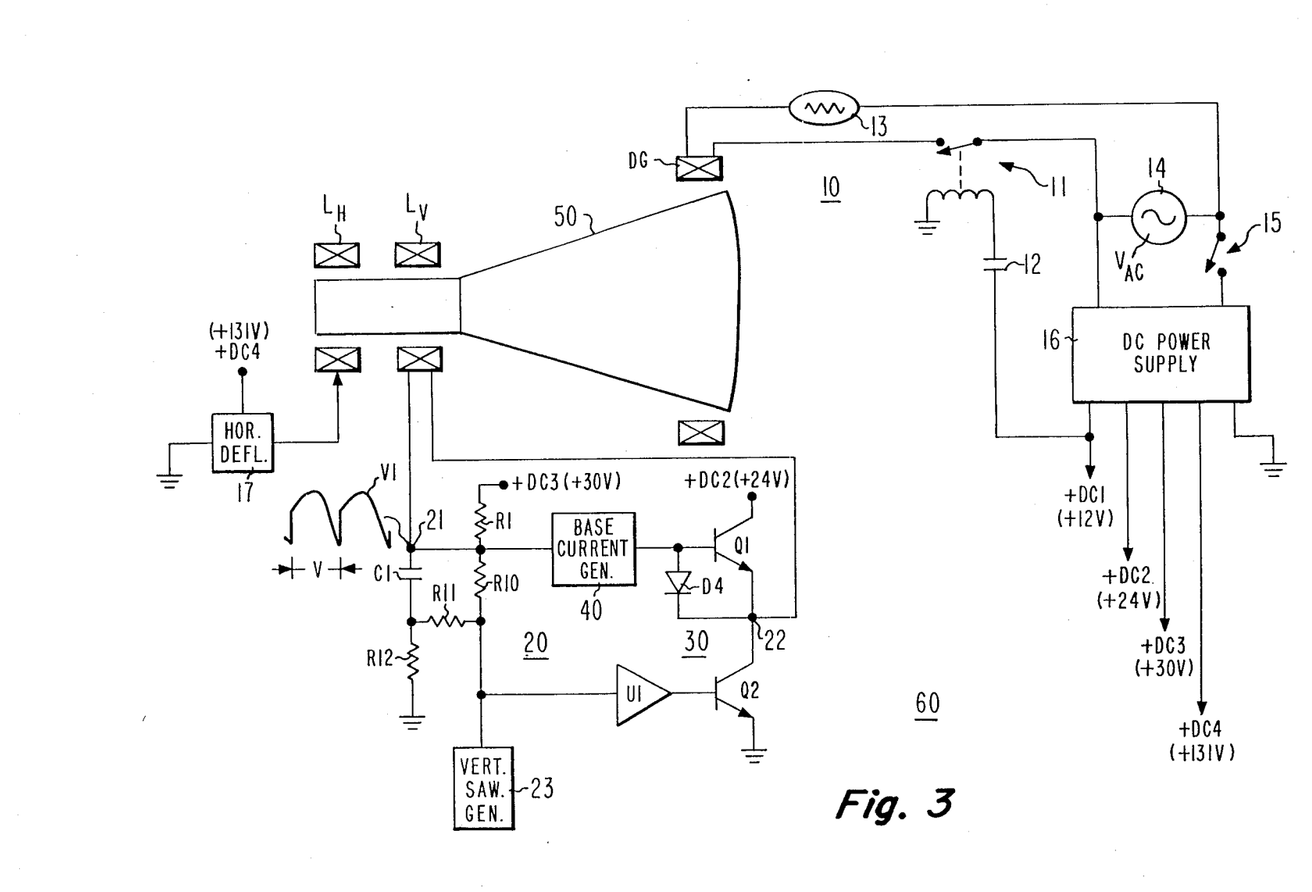
FIG. 3 illustrates a video display apparatus, embodying the invention, wherein start-up of the vertical deflection circuit is delayed until after completion of degaussing.

FIG. 3 illustrates a portion of a video display apparatus 60, embodying an aspect of the invention, that includes a picture tube degaussing circuit 10 and vertical deflection circuit 20 of FIG. 1, wherein start-up of the vertical deflection circuit is delayed until after completion of degaussing. Vertical deflection circuit 20 of FIG. 1 is shown in FIG. 3 in partial detail only.

In FIG. 1, an AC mains supply, developing a voltage $V_{AC}$, energizes a DC power supply 16 when an on-off switch 15 is closed, or switched to the on-position. DC power supply 16 develops various DC supply voltages for the circuitry of video display apparatus 60 including a +DC1, a +DC2, a +DC3 and a +DC4 voltage. Voltage +DC4, for example, energizes a horizontal deflection circuit 17 to generate horizontal deflection current in a horizontal deflection winding $L_H$.

Degaussing circuit 10 includes a degaussing coil DG located adjacent a picture tube 50 of video display apparatus 60. Degaussing coil DG is coupled in series with a positive temperature coefficient thermistor 13, AC mains supply 14 and the mechanical switch portion of an electro-mechanical relay 11. The mechanical switch portion of relay 11 is normally open when the relay coil is deenergized.

To initiate a degaussing interval, when degaussing action takes place, on-off switch 15 is closed to permit DC power supply 16 to develop the DC supply voltages, including the +DC1 supply voltage. The +DC1 supply voltage is coupled via a charging capacitor 12 to the coil of relay 11. Current flows in the relay coil from the +DC1 supply, energizing the relay coil and closing the mechanical switch portion of degaussing relay 11. With the mechanical switch portion of relay 11 closed, AC degaussing current flows from AC mains supply 14 in degaussing coil DG and thermistor 13 at the frequency of AC mains voltage $V_{AC}$. As thermistor 13 self-heats by the degaussing current, its resistance increases producing a decaying alternating degaussing current that reaches a very low residual amplitude, bringing the degaussing interval to a conclusion. The decaying alternating degaussing current produces a decaying alternating degaussing magnetic field that degausses the shadow mask, magnetic shield and other magnetizable material associated with picture tube 50, but not illustrated in FIG. 3. After conclusion of the degaussing interval, series capacitor 12 charges to the +DC1 supply level, preventing current from flowing in the coil of relay 11. The mechanical switch portion of relay 11 returns to its normally opened position to eliminate the flow of even a residual current in degaussing coil DG after conclusion of the degaussing interval.

The DC supply voltages developed by power supply 16 are rapidly developed from a zero voltage level after on-off switch 15 is closed. In particular, the DC supply voltages developed for vertical deflection circuit 20 attain levels adequate to energize the vertical deflection circuit prior to the conclusion of the degaussing interval.

Advantageously, however, capacitor C1, whose voltage V1 controls operation of vertical deflection circuit 20, disables base current generator 40 to prevent the generation of vertical deflection current in vertical deflection winding $L_V$ immediately after on-off switch 15 is closed. Capacitor C1 is slowly charged from the +DC3 supply via resistor R1 to delay the enablement of base current generator 40 and thus to delay the generation of vertical deflection current until after conclusion of the degaussing interval. This delay avoids any undesirable interaction between the vertical deflection magnetic field and the degaussing process.

Figure 2:
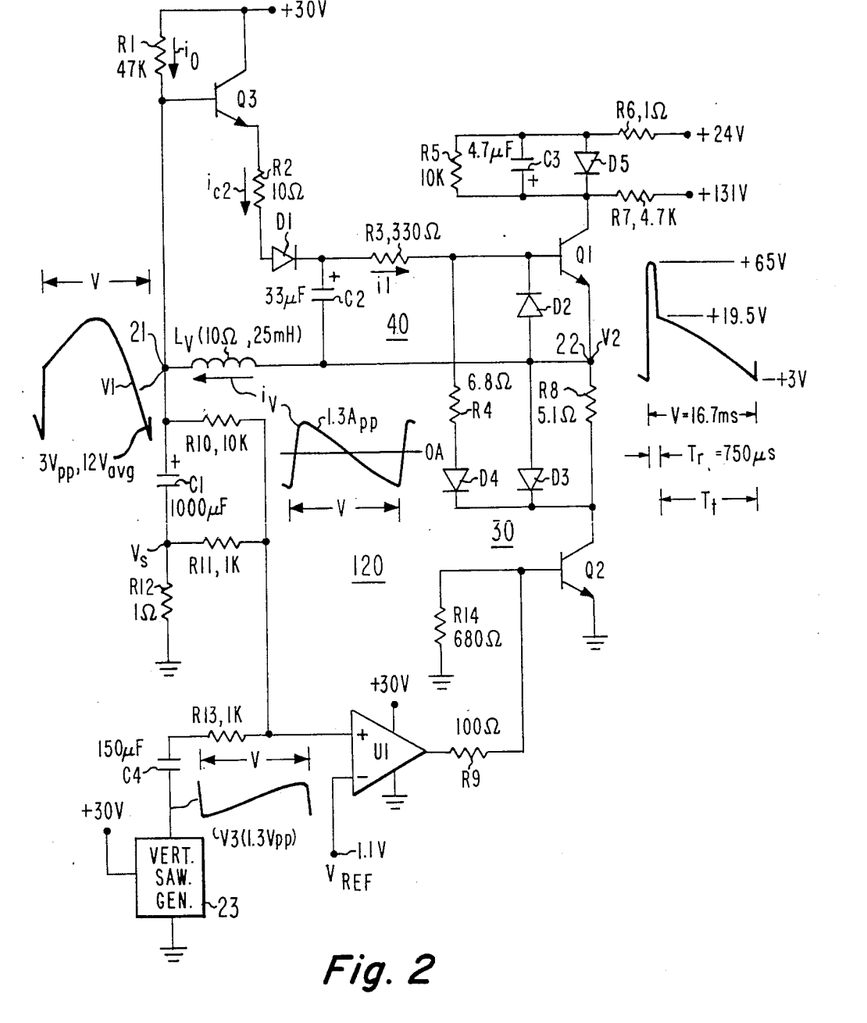

FIG. 2 illustrates a vertical deflection circuit 120, embodying the invention, similar to the vertical deflection circuit of FIG. 1, but modified to reduce any net DC current that may flow through deflection winding $L_V$ from auxiliary charging current $i_0$. Items in FIGS. 1 and 2 similarly identified represent similar elements or quantities.

In FIG. 2, a controllable impedance, a transistor Q3, is interposed between base current generating circuit 40 and the +30 V supply, with the collector of the transistor coupled to the +30 V supply and the emitter coupled to resistor R2. The base of transistor Q3 is coupled to S-capacitor terminal 21 at the junction of charging resistor R1 and S-capacitor C1. The S-capacitor voltage V1 controls the conductivity of transistor Q3 and the amount of current flowing in the collector circuit of transistor Q3 to base generating circuit 40.

Should capacitor C1 become short-circuited and voltage V1 decrease to near zero, transistor Q3 becomes cutoff, disconnecting the +30 V supply from base current generating circuit 40, and disabling the generation of current i1 into the base of top output transistor Q1. Similarly during start-up, because capacitor C1 is initially discharged, transistor Q3 is cutoff to disable top output transistor Q1. The auxiliary charging current $i_0$ charges capacitor C1 after a start-up delay to the value needed to turn on transistor Q3 for enabling base current generating circuit 40. Because of the gain provided by transistor Q3, charging current $i_0$ may be relatively small, and the net DC current component introduced into deflection winding $L_V$ by current $i_0$ is negligible.

What is claimed:

1. A deflection circuit, comprising:
   a deflection amplifier including first and second transistor amplifier output stages;
   a deflection winding coupled to said first and second transistor amplifier output stages at a deflection amplifier output terminal;
   an S-shaping capacitance coupled to said deflection winding at a second terminal remote from said amplifier output terminal for developing an S-capacitance voltage;
   a source of a deflection rate signal coupled to said deflection amplifier for generating a deflection current in said deflection winding;
   means coupled to said deflection amplifier and responsive to a voltage representative of said S-capacitance voltage for forming a DC negative feedback loop to stabilize the DC voltage at said output terminal; and
   a base current generating circuit coupled to one of said transistor amplifier output stages for providing base current thereto, said base current generating circuit being coupled to said second terminal and having said S-capacitance voltage applied thereto independently of said DC negative feedback loop for enabling the conduction of said base current.

2. A deflection circuit according to claim 1 including a DC voltage supply and means for charging said S-capacitance from said DC voltage supply above a predetermined magnitude.

3. A deflection circuit according to claim 2 wherein the conduction of said base current becomes disabled when said S-capacitance voltage is lower than said predetermined magnitude.

4. A deflection circuit according to claim 3, wherein the charging rate of said S-capacitance from said DC voltage supply is sufficiently low to provide a delay to the attainment of said predetermined magnitude for delaying the generation of said scanning current during a start-up interval.

5. A deflection circuit according to claim 2 wherein said charging means generates a charging current that bypasses said deflection winding.

6. A deflection circuit according to claim 5 wherein said charging means generates said charging current that bypasses a main current path of said on transistor amplifier output stage.

7. A deflection circuit according to claim 2 wherein said base current generating means includes a controllable semiconductor impedance responsive to said S-capacitance voltage for controlling the conduction of said base current in accordance with said S-capacitance voltage.

8. A deflection circuit according to claim 2 wherein said deflection current charges said S-capacitance each deflection cycle via said one transistor amplifier output stage and discharges said S-capacitance via the other stage.

9. A deflection circuit according to claim 8 wherein the two transistor amplifier output stages form a totempole configuration.

10. A deflection circuit according to claim 9 wherein said base current generating circuit includes a bootstrap capacitor coupled to said one transistor amplifier output stage and means responsive to said S-capacitance voltage for charging said bootstrap capacitor from said S-capacitance during a latter portion within a trace interval of each deflection cycle.

11. A circuit according to claim 10 wherein said bootstrap capacitor charging means includes means for applying said S-capacitance voltage to said bootstrap capacitor via a rectifier.

12. A deflection circuit, comprising:
a deflection winding;
an S-capacitance coupled to said deflection winding in a series deflection arrangement;
a source of supply voltage;
a deflection amplifier including first and second output stages coupled between said source and a point of reference potential, said first and second output stages being coupled to each other and to said series deflection arrangement at a deflection amplifier output terminal to form a push-pull configuration that charges said S-capacitance from said source via said first output stage and that discharges said S-capacitance via said second output stage, thereby developing an S-capacitance voltage;
a source of a deflection rate input signal coupled to said deflection amplifier for generating a deflection current in said deflection winding, said deflection amplifier including a control circuit that forms a negative feedback loop and that is responsive to said input signal for controlling conduction of said first and second output stages; and
means operating independently of said feedback loop and responsive to said S-capacitance voltage and coupled to said control circuit for cutting off conduction of said first output stage when said S-capacitance voltage is below a predetermined magnitude.

13. A deflection circuit, comprising:
a deflection amplifier;
a deflection winding coupled to an output terminal of said deflection amplifier;
an S-capacitance coupled to said deflection winding and being charged during steady state operation via a main charging path that includes a main current conduction path within said deflection amplifier for developing an S-capacitance voltage;
a control circuit coupled to said deflection amplifier and responsive to a deflection rate input signal for generating a deflection current in said deflection winding, said control circuit being responsive to said S-capacitance voltage for disabling operation of said deflection amplifier when said S-capacitance voltage is less than a predetermined magnitude; and
an auxiliary charging path for said S-capacitance that bypasses said main charging path for charging an initially discharged S-capacitance during a start-up interval to enable said operation of said deflection amplifier.

14. A deflection circuit according to claim 13 wherein said auxiliary charging path also bypasses said deflection winding.

15. A deflection circuit according to claim 14 wherein said S-capacitance is coupled to a terminal of said deflection winding remote from said output terminal.

16. A deflection circuit according to claim 15 wherein said main current conduction path is a main path of a transistor output stage within said deflection amplifier and wherein said control circuit includes a direct current path for forward base current in said transistor output stage from a DC voltage supply, said direct current path being disabled when said S-capacitance voltage is less than said predetermined magnitude.

17. A deflection circuit according to claim 16 wherein said direct current path includes a main current path of a semiconductor element, said S-capacitance voltage being applied to said semiconductor element for blocking the main current path thereof when said S-capacitance voltage is less than said predetermined magnitude.

18. A deflection circuit, comprising:
a deflection amplifier including first and second transistor amplifier output stages;
a deflection winding and an S-capacitance serially coupled to said first and second transistor amplifier output stages at a deflection amplifier output terminal, an S-capacitance voltage being developed across said capacitance during operation of said deflection amplifier and fed back to said deflection amplifier via a negative feedback loop;
a source of a deflection rate signal coupled to said deflection amplifier for generating a deflection current in said deflection winding; and
a base current generating circuit coupled to one of said transistor amplifier output stages for providing base current thereto, said base current generating circuit being coupled to said S-capacitance independently of said negative feedback loop and being dependent on said S-capacitance voltage as a DC voltage supply source for enabling the conduction of said base current.

19. A vertical deflection circuit of a video display apparatus with start-up of the vertical deflection circuit being delayed until after completion of degaussing, comprising:
an on-off switch;
a degaussing circuit responsive to said on-off switch for providing degaussing action during a degaussing interval initiated when said on-off switch is switched to an on-position;
a vertical deflection circuit including a vertical deflection winding and a capacitor in which capacitor there is developed a vertical rate voltage during steady state operation that controls the generation of vertical deflection current in said deflection winding;

a DC power supply for generating a DC supply voltage that energizes said deflection circuit, said DC power supply being responsive to said on-off switch to generate said DC supply voltage after said on-off switch is switched to the on-position, said DC supply voltage attaining a level adequate to energize said vertical deflection circuit prior to conclusion of said degaussing interval; and means for charging said capacitor from said DC power supply, after said on-off switch is switched to the on-position, at a sufficiently slow rate to delay the generation of said vertical deflection current past the conclusion of said degaussing interval.

* * * * *

UNITED STATES PATENT AND TRADEMARK OFFICE
CERTIFICATE OF CORRECTION

PATENT NO. : 4,700,114

DATED : Oct. 13, 1987

INVENTOR(S) : Hugh F. Sutherland, II

It is certified that error appears in the above-identified patent and that said Letters Patent is hereby corrected as shown below:

Column 2, line 19, that portion reading "magnet" should read -- magnetic --

Column 4, line 29, after "charges a" insert -- retrace capacitor C3 coupled across diode D5. When --

Signed and Sealed this

Twenty-fifth Day of October, 1988

Attest:

DONALD J. QUIGG

Attesting Officer

Commissioner of Patents and Trademarks